United States Patent
Högerl et al.

(10) Patent No.: US 6,774,483 B2
(45) Date of Patent: Aug. 10, 2004

(54) SEMICONDUCTOR ASSEMBLY WITH A SEMICONDUCTOR MODULE

(75) Inventors: Jürgen Högerl, Regensburg (DE); Erich Syri, Wenzenbach (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/414,837

(22) Filed: Apr. 16, 2003

(65) Prior Publication Data

US 2003/0193085 A1 Oct. 16, 2003

(30) Foreign Application Priority Data

Apr. 16, 2002 (DE) .......................................... 102 16 823

(51) Int. Cl.[7] .............................................. H01L 23/34
(52) U.S. Cl. ........................................ 257/723; 257/693
(58) Field of Search ................................ 257/687, 723, 257/693, 690, 678

(56) References Cited

U.S. PATENT DOCUMENTS 5,563,838 A * 10/1996 Mart et al. ................ 365/226
5,576,554 A    11/1996 Hsu
6,445,592 B1 *  9/2002 Schrimer .................. 361/762

FOREIGN PATENT DOCUMENTS

DE   295 13 488 U1   12/1995
DE   197 28 953 A1    1/1999

* cited by examiner

Primary Examiner—Roy Potter
(74) Attorney, Agent, or Firm—Laurence A. Greenberg; Werner H. Stemer; Gregory L. Mayback

(57) ABSTRACT

A semiconductor assembly includes a module holder and a semiconductor module, which has a board substrate with conductor tracks and one or more unpackaged semiconductor chips mounted on the substrate, which are connected to conductor tracks on the substrate by electrical contacts. The substrate has at one edge at least one contact strip with connection contact areas, which are connected to at least some of the conductor tracks. The module holder has a plug-in connection for the electrical connection to other components, at least one mating contact strip for the connection to the contact strip of the at least one semiconductor module and electrical conductors between the contact areas of the at least one semiconductor module and electrical contacts of the plug-in connection. The configuration allows semiconductor modules to be connected to the outside world in an economical way.

20 Claims, 2 Drawing Sheets

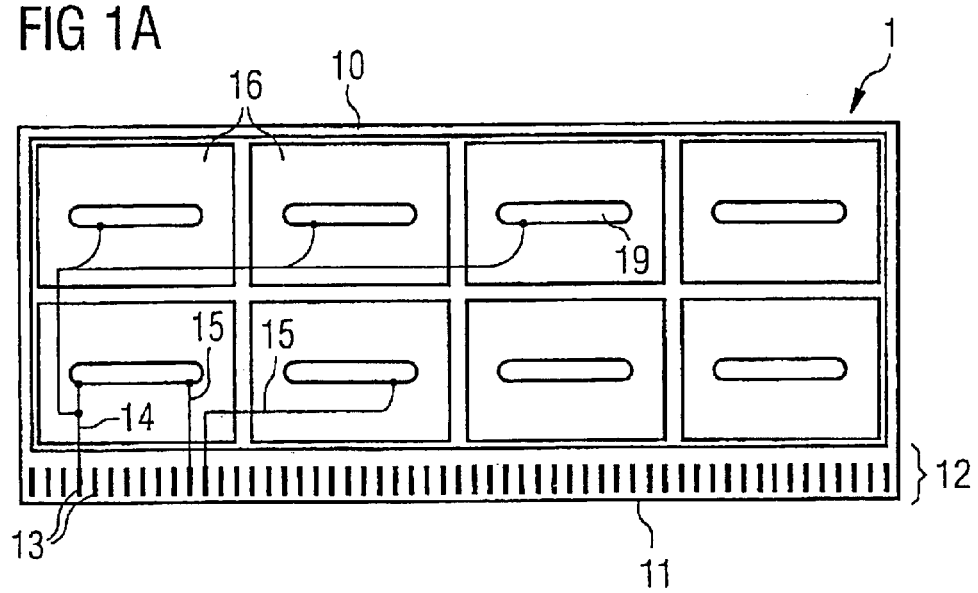
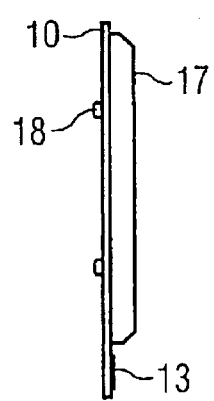

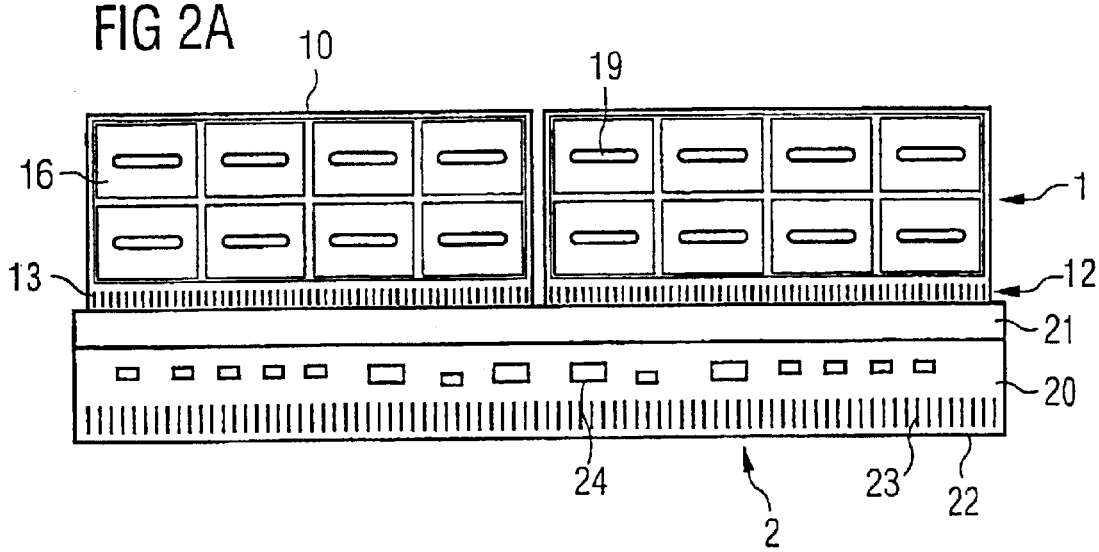
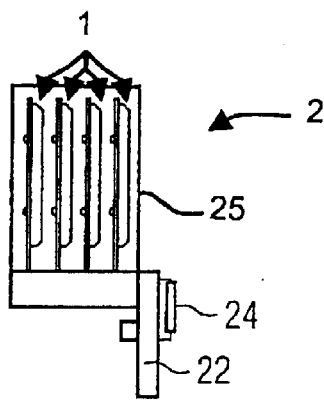
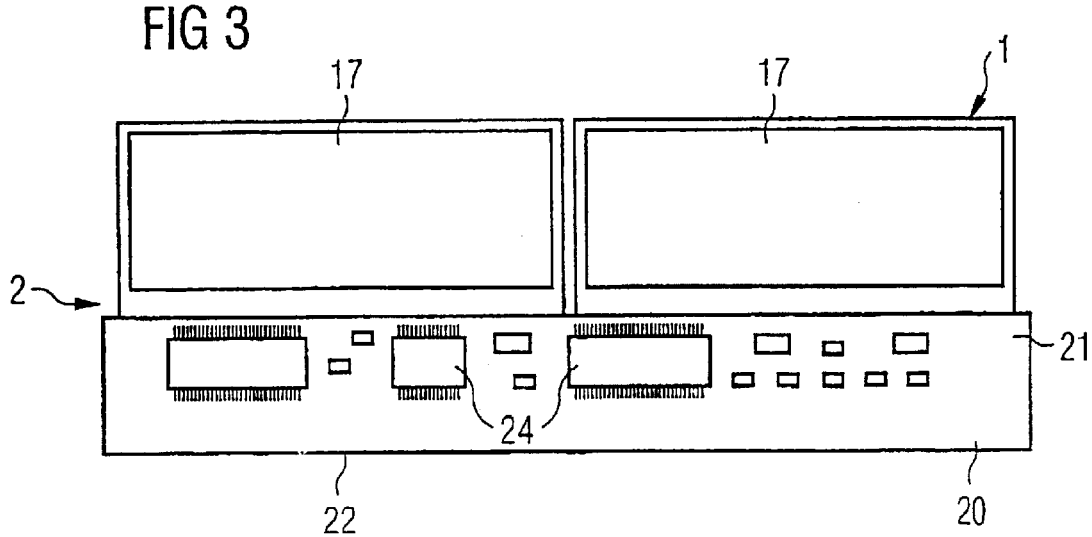

SEMICONDUCTOR ASSEMBLY WITH A SEMICONDUCTOR MODULE

BACKGROUND OF THE INVENTION

Field of the Invention

The invention relates to a semiconductor assembly with a semiconductor module, in which unpackaged semiconductor chips are connected directly to a board substrate, the semiconductor assembly integrating the semiconductor module by a module holder.

Previous electronics boards loaded with integrated circuits include the actual printed circuit board, usually a flat board with conductor tracks that is produced from synthetic resin with integrated glass fibers and to which the integrated circuit components are applied individually or in a stacked form, these components having not only the actual, metallic semiconductor chip but also packages. The semiconductor chips are electrically connected to the board by connecting elements on the packages, such as contact feet or contact balls, with corresponding contact areas of the conductor tracks. In the course of the progressive miniaturization of components or the steadily increasing integration density of components in a given surface area of a printed circuit board (for example, in the data processing sector), the restrictions with regard to the usability of customary packaged semiconductor devices are also increasing, however. This is particularly marked in the case of semiconductor modules, for instance, DRAM, SDRAM, or RAMBUS memories, because only given maximum sizes are available for these on account of specifications arising from efforts by the manufacturers of data processing systems to achieve standardization.

Main memory modules are generally inserted in edge connectors provided for them on so-called main boards, which, likewise, contain the processor and the electronic components for activating peripheral devices. Such memory modules include a small board. Mounted on the small board are the individual memory devices, which are attached on the board by their packages and are electrically connected to conductor tracks located on the board. The boards in the memory modules have at one edge a contact strip, at which the conductor tracks are led to the outside and with which the board can be pushed into the edge connectors of main boards. These connections are standardized to ensure any desired exchangeability of memory modules on different main boards. In the case of other electronic equipment, such as integrated equipment or controllers, similar sets of requirements exist for memory devices or other components. For instance, extender modules with a functionality extending an item of equipment, for example, a modem or an I/O board, can be inserted into slots provided for them, the modules having a similar construction to the memory devices described above.

In all these cases, the space available for the insertion modules is limited because the width is limited to a maximum value by the edge connector and further requirements of the equipment manufacturers and the height is usually limited to a maximum value by further components mounted on top, or by air circulation problems etc. With previous integration techniques of packaged semiconductor components on such memory modules, limits of integration density are encountered even if the board substrates are loaded with components on both sides. The high number of individually packaged semiconductors located on customary memory modules also increases the probability of defects of a corresponding module, either directly during manufacture or in later operation. For the purpose of further increasing the integration density, it would, therefore, be desirable to introduce a concept by which the spatial limitations of previous approaches are overcome and with which the capability of eliminating defects is improved.

SUMMARY OF THE INVENTION

It is accordingly an object of the invention to provide a semiconductor assembly with a semiconductor module that overcomes the hereinafore-mentioned disadvantages of the heretofore-known devices of this general type and that applies the metallic semiconductor chips to a board substrate directly, that is, without previously accommodating them in a package, and leading the contacts of these semiconductors to the outside at one edge by conductor tracks.

With the foregoing and other objects in view, there is provided, in accordance with the invention, a semiconductor assembly, including at least one semiconductor module having a board substrate having conductor tracks, an edge, and at least one contact strip with connection contact areas electrically connected to at least some of the conductor tracks, the at least one contact strip disposed at the edge, and at least one unpackaged semiconductor chip mounted on the substrate and electrically connected to at least some of the conductor tracks, and a module holder having a plug-in connector to be electrically connected to other components, the plug-in connector having electrical contacts, at least one mating contact strip removably receiving the at least one contact strip for electrically connecting the at least one contact strip, and electrical conductors disposed between the contact areas of the at least one semiconductor module and the electrical contacts of the plug-in connector for electrically connecting the contact areas of the at least one semiconductor module and the electrical contacts of the plug-in connector.

With the objects of the invention in view, there is also provided a semiconductor assembly, including at least one semiconductor module having a board substrate having conductor tracks, electrical contacts, an edge, and at least one contact strip with connection contact areas electrically connected to at least some of the conductor tracks, the at least one contact strip disposed at the edge, and at least one unpackaged semiconductor chip mounted on the substrate and electrically connected to at least some of the conductor tracks through the electrical contacts, and a module holder having a plug-in connector to be electrically connected to other components, the plug-in connector having electrical contacts, at least one mating contact strip removably receiving the at least one contact strip for electrically connecting the at least one mating contact strip to the at least one contact strip, and electrical conductors disposed between the contact areas of the at least one semiconductor module and the electrical contacts of the plug-in connector for electrically connecting the contact areas of the at least one semiconductor module and the electrical contacts of the plug-in connector.

An unpackaged semiconductor chip is to be understood for the purposes of the invention as meaning the platelet of a semiconductor, with the incorporated integrated circuit, obtained directly after wafer processing. The invention is based on Board on Chip—Backside Protect (BOC BSP), which was developed by Infineon AG and was originally developed to manufacture "ball grid array" components.

The semiconductor module has a board substrate with conductor tracks and one or more unpackaged semiconductor chips mounted on the substrate, which are connected to conductor tracks on the substrate by electrical contacts. The substrate has at one edge at least one contact strip with connection contact areas, which are connected to at least some of the semiconductor tracks. A board substrate is to be understood here for the purposes of the invention as meaning any preferably sheet-like formation that is capable of being provided with conductor tracks and of receiving the unpackaged semiconductor chips. Conductor tracks are to be understood as meaning flat metal strips that extend on or in the board substrate and serve for conducting electrical signals from and to the various electronic components on the board substrate. An unpackaged semiconductor chip is to be understood as meaning a semiconductor, for example, an integrated circuit, in which the metallic chip is not surrounded by a package. It is, consequently, the chip as obtained immediately after individual separation and, possibly, subsequent treatment of the individual elements of the wafer. Such a semiconductor chip generally has an underside that is of silicon or a comparable material, such as gallium arsenide, and into which the various structures have been introduced or applied in the direction of its upper side by the customary methods of semiconductor manufacture. On the upper side there are, generally, also the electrical contacts, which serve for the connection of the semiconductor chip to the outside world. By contrast with conventional semiconductor chips (in which the underside is attached to an underlying surface during packaging and the electrical contacts of the semiconductor are, then, electrically connected, for example, by fine wires, to corresponding mating contacts of the package, on the underlying surface of which the semiconductor chip has been adhesively attached), in the case of the present invention, the semiconductor chip is, preferably, applied with its upper side to the board substrate, to permit shortest possible contact paths. However, it is also possible to adhesively attach the semiconductor chip or chips by the undersides to the board substrate or attach them in some other way and stretch wires between the electrical contacts and the conductor tracks on the substrate.

The substrate has a contact strip at one edge. This is similar in its basic construction to the contact strips known, for example, in the case of memory modules for the pushing in of plug-in connectors, but may be configured to be as small and fine as desired because, depending on the embodiment, it is not necessary to pay heed to existing standards. The connection contact areas serve for bringing the semiconductor chips into contact with the outside world, such as, for example, further components or electronic equipment, by connecting up the conductor tracks. The connection contact areas do not have to be connected to all the conductor tracks located on the board substrate. Rather, some of the conductor tracks may also serve for the internal connection of the various unpackaged semiconductor chips disposed on the board substrate.

These internal conductor tracks may contribute to reducing the outward complexity of the semiconductor module. If the unpackaged semiconductor chips that are disposed on the board substrate, for example, during the production of memory modules, are at least partly identical, it is preferred for the semiconductor chips to be internally interconnected such that such signal inputs and/or outputs of the semiconductor chips that are shared by the various semiconductor chips are led to common connection contact areas. Typical examples of such common signal inputs and/or outputs that can lead to common connection contact areas are, for example, power supply lines, address bus or data bus lines, clock lines, or activation and deactivation lines (enable, disable). Other lines must be led out on an individualized basis, for example, lines for selecting individual chips (chip select) or lines for driving individual semiconductor chips on the semiconductor module that are not identical to other semiconductor chips on the module. For a completely addressable, eight-bit memory module, the number of necessary connections can, consequently, be reduced to about 50, for example, 54.

In accordance with another feature of the invention, the board substrate has at least one aperture, through which at least one semiconductor chip is mounted, the electrical contacts of which lie in the region of the aperture and are connected through the aperture to conductor tracks on or in the substrate. Such a preferred embodiment corresponds from the configuration of the semiconductor chips and the aperture in the substrate to the BOC BSP configuration of Infineon AG, although, according to the invention, no "ball grid arrays" are connected to the contacts led through the aperture. In the case of this embodiment, the contacts of the unpackaged semiconductor chips are accessible through the apertures for further processing during production and can, for example, be connected to the conductor tracks by wires reaching through the aperture or can be soldered directly to conductor tracks disposed at the edge of the aperture.

The already provided contact strip of the semiconductor module with connection contact areas may be wired in various ways. For instance, a plug system on which the connection contact areas are located and which is attached to the edge of the board substrate may be provided. With such a plug, connections can, then, be established with corresponding mating plugs on, for example, main boards or other equipment elements to which the semiconductor module is to be connected.

A particularly simple embodiment is obtained if, in a way comparable to the connection regions of current memory modules, the contact strip is a contact region of the substrate on which the connection contact areas are disposed parallel to one another as specially configured regions of the conductor tracks. As such, no further elements are required apart from the actual conductor tracks to bring about contact by pushing into a corresponding holder ("slot").

As already stated, in particularly preferred embodiments the semiconductor chips may be memory devices. The homogeneity of a large number of memory devices that can be accommodated on such modules allows a high integration density to be produced in a particularly simple way. However, the semiconductor chips may also include Application Specific Integrated Circuits (ASIC) or microprocessors etc., so that, overall, there are no limits to the functional configuration of the semiconductor modules. The board substrate may, preferably, be a flat board of a material that has synthetic resin, for example, a synthetic-resin glass-fiber composite. The board substrate, consequently, corresponds in terms of its structure to previously known printed circuit boards.

The entire know-how available with respect to the manufacture of printed circuit boards can also be applied to the board used for the semiconductor module. For example, the conductor tracks of the board substrate may be disposed in a number of wiring planes, which bring about a sandwich-like construction of the board substrate. The individual wiring planes may be connected to one another by contacting points, which extend in the transverse direction of the conductor track areas.

In one embodiment, a further increase in the integration density can be achieved, which is not possible in principle with individually packaged semiconductor chips. This is because it is also possible for a plurality of identical semiconductor chips that are not individually separated to be disposed on the board substrate. Semiconductor chips are produced in wafers, generally round disks, into which a multiplicity of such semiconductor chips is incorporated during the production of the semiconductor chips. In conventional use, the semiconductor chips are diced (individually separated) and subsequently fitted into the desired form of package. The use of unpackaged semiconductor chips has made it possible, however, to dispense with such individual separation. Rather, after manufacture on the wafer, entire blocks with a plurality of semiconductor chips remain joined together on the wafer and are attached, as such an assembly, directly on the board substrate. The elimination of spacings otherwise to be maintained between the individual semiconductor chips along with simultaneously ensured exact positionability of the chips allows further space to be saved on the semiconductor module, and, consequently, the integration density to be increased.

The contact strip at the edge of the semiconductor module with the connection contacts can, as already stated above, be fitted out as desired, depending on the intended use, for example, with very fine contacts, to permit smallest component dimensions in the case of special equipment. However, it is also possible to configure the contact strips such that they satisfy existing standards, in order to be used directly as standard components. It is, in this way, possible to maintain the dimensions customary in the case of DIMMs and, consequently, to be able to use the semiconductor modules of the present invention directly as memory devices for computers, for example. The spacings can, likewise, be dimensioned such that edge connectors that can serve for the connection to other components by such a plug system can be attached directly to the modules. For example, the contact strips may be configured such that the semiconductor module can be fitted directly into a compact package, such as, for example, a PCMCIA package or a Compact Flash package or an MMC package.

Depending on the planned later use of the semiconductor module, it may be desirable to protect the semiconductor module, in particular, the unpackaged semiconductor chips and the contact wires for connecting the electrical contacts of the semiconductor chips to the conductor tracks, from being touched by users or by further components, in order to avoid defects. For such a purpose, it is preferred for the semiconductor module to have a covering, which covers at least the semiconductor chips and the contacts to the conductor tracks. Covers that are attached on one or two sides of the semiconductor module may be used for this purpose. It is preferred, in particular, for the covering to be sealed on the semiconductor module according to the invention. In particular in the case of configurations with an aperture through which the contacts of the semiconductor chips are accessible, this permits complete filling of these apertures and, consequently, good protection of wires leading out, it also being possible, at the same time, for the semiconductor chips to be covered on the other side by sealing with a protective layer. This embodiment, again, corresponds substantially to the previously known BOC BSP configuration of Infineon AG. Thus, one having ordinary skill in the art would know in an individual case how to produce such a covering.

Alternatively, sensitive regions of the semiconductor module can also be protected by printing with a correspondingly suitable polymer, for example, by inkjet technology or the like.

The invention is, now, directed specifically at a semiconductor assembly, which has at least one semiconductor module as described above and a module holder with a plug-in connection for the electrical connection to other components, with at least one mating contact strip for the connection to the contact strip of the at least one semiconductor module, and with electrical conductors between the contact areas of the at least one semiconductor module and electrical contacts of the plug-in connection. The semiconductor assembly according to the invention, consequently, has two main components, that is, the semiconductor module as described above and a module holder. The module holder, in turn, includes three functional regions: first, a plug-in connection of any desired type, with which the semiconductor assembly can be brought into electrical connection with other electrical items of equipment, for example, a main board of a computer; second, a region with a mating contact strip for the connection to the contact strip of the semiconductor module or modules; and, third, a region that serves for the electrical connection of the first and second regions. While generally only one plug-in connection is provided, with which the semiconductor assembly according to the invention can come into contact with the outside world, a mating contact strip is to be provided for each semiconductor module provided, for the connection to the contact strip to the respective semiconductor module.

The electrical wiring between the semiconductor modules used and the plug-in connection led to the outside can take place in a known way, for example, by conductor tracks applied to boards with wires, with contact bows, or with similar devices. The number of semiconductor modules that can be integrated in a semiconductor assembly according to the invention is dependent only on the electrical and spatial conditions. In the simplest case, the module holder acts merely as a kind of adapter, with which an individual semiconductor module can be adapted by the holder to any desired other plug-in systems. Preferably, however, specifically on account of the high integration density of the semiconductor modules, a plurality of semiconductor modules are disposed on the module holder to profit especially from the advantages of the semiconductor module. For instance, it is conceivable to integrate four or even eight of the semiconductor modules described above in a semiconductor assembly according to the invention, for example, when using the semiconductor modules for memory blocks, such as DRAM or RAMBUS units. Thus, a number of semiconductor modules can be disposed one behind the other on the semiconductor assembly. This is to be understood as meaning that the semiconductor modules are aligned spaced apart, with their main surfaces parallel to one another.

In accordance with a further feature of the invention, the at least one semiconductor module is a plurality of semiconductor modules removably disposed one behind another at the module holder.

Just as on the semiconductor modules, components that are connected to conductor tracks and that serve for influencing electrical signals that can be routed through the conductor tracks may also be provided in the region of the module holder. As such, any desired additional control functions, selection functions, or level adaptations and the like that are necessary for the electrical connection of the semiconductor modules to the outside world in the actual context of the semiconductor assembly according to the invention can be implemented.

The semiconductor assembly according to the present invention may also have a covering to protect the semiconductor modules. This may be, for example, a shroud that is fitted over all the semiconductor modules.

Because an important area of use of the semiconductor assemblies according to the invention is in the area of standard components, such as, for example, memory blocks, it is further preferred for the plug-in connection to be an edge connector of a standardized type. A standard is to be understood here as meaning a standard type of construction that has been developed by a national or nationally appointed institution, or a de facto standardized type of construction, for example, at the initiative of a company.

A preferred method of manufacturing a semiconductor module includes the steps of:
  providing a board substrate with conductor tracks, the substrate having at one edge at least one contact strip with connection contact areas, which are connected to at least some of the conductor tracks;
  mounting one or more unpackaged semiconductor chips on the board substrate; and
  connecting contacts on the semiconductor chips to conductor tracks on the substrate.

In a preferred embodiment, the board substrate has at least one aperture, the at least one semiconductor chip being mounted on a surface of the substrate such that its contacts are accessible at the aperture from the other surface of the substrate, the connecting of contacts taking place through the aperture. As already stated above, it is possible, here, for wires to be drawn between the contacts of the semiconductor chips and the points of attachment of the conductor tracks, or it is possible for soldering to take place directly between the contacts of the semiconductor chips and connection points of the conductor tracks.

The method may be, additionally, supplemented by the following, further step of sealing a plastic material onto the semiconductor module to protect the semiconductor chips and the connection between the semiconductor chips and the conductor tracks.

Alternatively, this step may also take the form of printing a protective layer onto the semiconductor module to protect the semiconductor chips and the connection between the semiconductor chips and the conductor tracks.

Other features that are considered as characteristic for the invention are set forth in the appended claims.

Although the invention is illustrated and described herein as embodied in a semiconductor assembly with a semiconductor module, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1A is a plan view of a schematized semiconductor module according to the invention;

FIG. 1B is a side view of the semiconductor module of FIG. 1A with the covering being represented in particular;

FIG. 2A is a plan view of a semiconductor assembly according to the invention with a module holder and two semiconductor modules;

FIG. 2B is a side view of the semiconductor assembly of FIG. 2A; and

FIG. 3 is a plan view of the semiconductor assembly of FIG. 2A opposite the side illustrated in FIG. 2A.

DESCRIPTION OF THE PREFERRED EMBODIMENTS

The present invention presents high-density semiconductor modules in combination of a further developed BOC configuration. Previous approaches taken to realizing electronic assemblies are usually based on a printed circuit board ("PCB"), to which individual or stacked components are applied. For such a purpose, these components, for example, packaged semiconductor components, are provided with connecting elements, such as contact feet or balls. The application and connection are performed in separate processes.

According to the present invention, a BT substrate with a wiring plane on one or both sides is generally used as the base material. Contrary to configuration known from the prior art (in which each component represents an individual unit), according to the present invention, a number of unpackaged semiconductor chips are combined to form a unit. The contact points or landing pads (likewise known from the prior art for the small balls typically used in the case of "ball grid arrays") are not implemented here, instead, the individual chips, preferably, are connected to one another such that all the semiconductor chips can be addressed from a contact strip lying at the edge, with for example, lines, such as PWR, GND, or DQs being grouped together, while separate chip selects are brought up to each unpackaged semiconductor chip.

A person skilled in the art is entirely familiar with the processes necessary for manufacturing such a semiconductor module as standard processes, such as for example "die bonding," "plasma cleaning," "wire bonding," and molding (injection molding of a covering) or printing with polymer of the rear side of the semiconductor module (to which the semiconductor chips have been applied) and apertures possibly present (the so-called bond channels). The "ball-attach" process used in the case of similar methods may be omitted completely because a contact strip at the edge provides corresponding connection contact areas. As already described above, even the dicing of the components may be omitted if the semiconductor module is suitably dimensioned. The customary tests of the components, such as the "backend" test and "burn-in," can, preferably, be carried out on the completely manufactured semiconductor module, the high degree of parallelism obtained at least in the case of memory modules having positive effects on the test times. Provided that there are good "backend" yields and a suitable preliminary test is chosen at the wafer level, the failure rate of the semiconductor modules can be lowered decisively.

To connect the semiconductor modules to the outside world, a module holder (the so-called multi-functional plug) is used. The holder may resemble a conventional PCB in that it has a standardized edge connector, such as, for example, 168-pin or 184-pin plugs for memory devices. In addition, the necessary active components, such as EEPROMs, registers or PLLs, or passive components, such as resistors, capacitors, can be applied to or introduced into the module holder. For connection with the semiconductor modules, the module holder has slide-in units, into which the semiconductor modules can be fitted one behind the other, one next to the other, or one on top of the other.

The surface mounting technology process usually necessary is omitted entirely for the individual components. Resistors or capacitors necessary for the fine tuning of the entire semiconductor assembly may either be applied to the module holders or embedded in their base material. To protect the module holders or the semiconductor assemblies from excessive mechanical loads, they may be protected with an additional covering. An additional effect of this covering may be the removal of heat.

The present invention has numerous advantages over solutions known from the prior art. For instance, it is possible to produce a VLSI chip carrier, such as, for example, a memory block, based upon a BOC process. The number of necessary process steps can be reduced because steps such as the ball attachment, dicing of the chips, and specific soldering processes for individual components can be omitted. Because the module holder of the semiconductor assembly according to the invention can be loaded with components as desired, it is possible, for example, when manufacturing memory devices, for the storage capacity to be freely configured by the use of different semiconductor modules according to the invention, without a considerable number of different components having to be kept ready. The semiconductor assembly according to the invention can also be repaired in a simple way because, in the case of a defect, the defective semiconductor module can simply be reversibly dissolved out. The module holder can be regarded as a universal multi-functional socket, which can be obtained in its complete form from a subcontractor, which may lead to the omission of the in-house surface mounting technology process. Finally, embedded passive components may be used by the method and semiconductor module according to the invention also at the BOC substrate level.

Referring now to the figures of the drawings in detail and first, particularly to FIG. 1A thereof, there is shown a semiconductor module 1 with a board substrate 10 and unpackaged semiconductor chips 16. The board substrate has at one edge 11 a contact strip 12 with connection contact areas 13. Contacts of individual semiconductor chips are connected to connection contact areas 13 by conductor tracks 14 and 15. It is pointed out here that this is a schematic representation because the semiconductor chips and the conductor tracks possibly located on the other side of the board substrate cannot, of course, be shown simultaneously. The conductor track 14 shows, as an example, how identical contacts of the various chips can be connected to one another and combined to be led to the outside at a common connection contact area 13. Conductor tracks 15 show, on the other hand, that other contacts, such as chip select signals, for example, have to be individually selected for each semiconductor chip so that they have to be routed individually to different connection contact areas 13. In the present embodiment, the board substrate has apertures 19 (bond channels), through which the contacts of the unpackaged semiconductor chips are accessible from the other side of the board substrate and from where they can be connected to connection points for the conductor tracks 14, 15 by non-illustrated wires.

FIG. 1B shows a corresponding semiconductor module in side view. Apart from the substrate 10, in this representation there can be seen a covering 17, which also emerges on the other side of the board substrate 10 through the apertures 19 as a protuberance 18. It goes without saying that other embodiments are also possible, for example, those in which the unpackaged semiconductor chips used bear the contacts not in the center of the upper side but at the edge so that no apertures 19 are necessary. Instead, the contacts are contacted at the edge.

FIG. 2A shows a semiconductor assembly according to the invention that includes the semiconductor modules 1 shown in FIG. 1A and a module holder 20. The module holder 20 has a securing region 21 with a row of mating contact strips (represented in FIG. 2B) for pushing in semiconductor modules 1. It also has a plug-in connection 22 for the electrical connection to other components, such as, for example, the main board of a computer. Provided at the plug-in connection 22 are a row of contacts 23 that effect a connection between the contacts of the semiconductor modules and the outside world by non-illustrated internal lines. The plug-in connection has, in the present embodiment, further active or passive components 24 that are fitted into the conductor tracks and serve for the further modification of the signals and levels.

In FIG. 2B, a semiconductor assembly 2 according to the present invention is shown in side view. In addition to a total of four semiconductor modules 1 represented, which are inserted into the plug-in connection 22, the assembly 2 also has a cover 25 to protect the semiconductor modules from damage. It is also evident from the drawing that the semiconductor modules can be disposed with a small spacing in relation to one another. Depending on the choice of the board substrate 10 and the covering 17, a grid spacing of about 1 mm can be achieved because the actual unpackaged semiconductor chips are very flat in comparison with semiconductor packages.

FIG. 3 shows the rear side of a corresponding semiconductor assembly 2 with coverings 17 of the semiconductor modules 1 according to the invention and further components 24.

The present invention uses semiconductor modules, which permit an extremely high degree of integration along with simultaneously simplified production and high operational reliability.

We claim:

1. A semiconductor assembly, comprising:
   at least one semiconductor module having:
      a board substrate having:
         conductor tracks;
         an edge; and
         at least one contact strip with connection contact areas electrically connected to at least some of said conductor tracks, said at least one contact strip disposed at said edge; and
      at least one unpackaged semiconductor chip mounted on said substrate and electrically connected to at least some of said conductor tracks; and
   a module holder having:
      a plug-in connector to be electrically connected to other components, said plug-in connector having electrical contacts;
      at least one mating contact strip removably receiving said at least one contact strip for electrically connecting said at least one contact strip; and
      electrical conductors disposed between said contact areas of said at least one semiconductor module and said electrical contacts of said plug-in connector for electrically connecting said contact areas of said at least one semiconductor module and said electrical contacts of said plug-in connector.

2. The semiconductor assembly according to claim 1, wherein said at least one semiconductor module is a plurality of semiconductor modules disposed one behind another on the semiconductor assembly.

3. The semiconductor assembly according to claim 1, wherein said at least one semiconductor module is a plurality of semiconductor modules removably disposed one behind another at said module holder.

4. The semiconductor assembly according to claim 1, further comprising components for influencing electrical signals to be routed through said conductor tracks, said components being disposed on said module holder and being electrically connected to said conductor tracks.

5. The semiconductor assembly according to claim 1, further comprising a cover covering and protecting said at least one semiconductor module.

6. The semiconductor assembly according to claim 1, wherein said at least one semiconductor module has a cover covering and protecting said at least one semiconductor module.

7. The semiconductor assembly according to claim 1, wherein said plug-in connector is a standard edge connector.

8. The semiconductor assembly according to claim 1, wherein said at least one unpackaged semiconductor chip of said semiconductor module is a plurality of unpackaged semiconductor chips interconnected to lead signal inputs or outputs shared by said chips to common ones of said contact areas.

9. The semiconductor assembly according to claim 1, wherein said board substrate has at least one aperture through which said at least one semiconductor chip is mounted, said at least one semiconductor chip having electrical contacts lying in a region of said at least one aperture and being electrically connected through said aperture to said conductor tracks.

10. The semiconductor assembly according to claim 9, wherein said electrical contacts of said at least one semiconductor chip are electrically connected to said conductor tracks by wires reaching through said aperture.

11. The semiconductor assembly according to claim 9, further comprising wires reaching through said aperture, said electrical contacts of said at least one semiconductor chip being electrically connected to said conductor tracks by said wires.

12. The semiconductor assembly according to claim 1, wherein said at least one contact strip is a contact region of said substrate on which said contact areas are disposed parallel to one another as configured regions of said conductor tracks.

13. The semiconductor assembly according to claim 1, wherein said at least one semiconductor chip is a memory device or an ASIC.

14. The semiconductor assembly according to claim 8, wherein said semiconductor chips are memory devices or ASICs.

15. The semiconductor assembly according to claim 1, wherein said conductor tracks are disposed in a plurality of wiring planes.

16. The semiconductor assembly according to claim 1, wherein said at least one unpackaged semiconductor chip is a plurality of identical, not individually separated semiconductor chips.

17. The semiconductor assembly according to claim 1, wherein:
said conductor tracks have contacts; and
said at least one semiconductor module has a cover covering at least said at least one semiconductor chip and said contacts of said conductor tracks.

18. The semiconductor assembly according to claim 8, wherein:
said conductor tracks have contacts; and
said at least one semiconductor module has a cover covering at least said semiconductor chips and said contacts of said conductor tracks.

19. The semiconductor assembly according to claim 16, wherein:
said conductor tracks have contacts; and
said at least one semiconductor module has a cover covering at least said semiconductor chips and said contacts of said conductor tracks.

20. A semiconductor assembly, comprising:
at least one semiconductor module having:
a board substrate having:
conductor tracks;
electrical contacts;
an edge; and
at least one contact strip with connection contact areas electrically connected to at least some of said conductor tracks, said at least one contact strip disposed at said edge; and
at least one unpackaged semiconductor chip mounted on said substrate and electrically connected to at least some of said conductor tracks through said electrical contacts; and
a module holder having:
a plug-in connector to be electrically connected to other components, said plug-in connector having electrical contacts;
at least one mating contact strip removably receiving said at least one contact strip for electrically connecting said at least one mating contact strip to said at least one contact strip; and
electrical conductors disposed between said contact areas of said at least one semiconductor module and said electrical contacts of said plug-in connector for electrically connecting said contact areas of said at least one semiconductor module and said electrical contacts of said plug-in connector.

* * * * *